United States Patent
Takahashi et al.

(10) Patent No.: US 7,690,960 B2
(45) Date of Patent: Apr. 6, 2010

(54) PRODUCTION METHOD OF ORGANIC EL DEVICE AND CLEANING METHOD OF ORGANIC EL DEVICE PRODUCTION APPARATUS

(75) Inventors: Natsuki Takahashi, Kanagawa (JP);
Koichi Sakasegawa, Kanagawa (JP);
Takeshi Igarashi, Kanagawa (JP);
Yasuki Nishinobo, Kanagawa (JP);
Masahiko Otomo, Kanagawa (JP);
Osamu Irisawa, Kanagawa (JP); Kazuo Yamada, Kanagawa (JP)

(73) Assignee: ULVAC, Inc., Chigasaki-shi (JP)

( * ) Notice: Subject to any disclaimer, the term of this patent is extended or adjusted under 35 U.S.C. 154(b) by 638 days.

(21) Appl. No.: 11/628,064

(22) PCT Filed: May 31, 2004

(86) PCT No.: PCT/JP2004/007482

§ 371 (c)(1),
(2), (4) Date: Nov. 30, 2006

(87) PCT Pub. No.: WO2005/117498

PCT Pub. Date: Dec. 8, 2005

(65) Prior Publication Data

US 2007/0254552 A1    Nov. 1, 2007

(51) Int. Cl.
*H01J 9/00* (2006.01)
(52) U.S. Cl. ....................................... 445/24
(58) Field of Classification Search ................... 445/58, 445/59, 23–25; 427/66
See application file for complete search history.

(56) References Cited

U.S. PATENT DOCUMENTS 6,333,065 B1    12/2001    Arai et al. .................... 427/66

FOREIGN PATENT DOCUMENTS

| JP | 62-124285 | 6/1987 |
|---|---|---|
| JP | 6-304465 | 11/1994 |
| JP | 11-45779 | 2/1999 |
| JP | 2003-313654 | 11/2003 |
| JP | 2004-47452 | 2/2004 |
| JP | 2004-063210 | 2/2004 |
| JP | 2004-171862 | 6/2004 |
| JP | 2004-192858 | 7/2004 |

OTHER PUBLICATIONS

Office Action dated Jun. 6, 2008 corresponding to Chinese patent application No. 200480043619.5.

*Primary Examiner*—Joseph L Williams
(74) *Attorney, Agent, or Firm*—Kratz, Quintos & Hanson, LLP

(57) ABSTRACT

The object of the present invention is to provide a method of stably producing a high quality organic EL device by surely avoiding adverse influence due to organic matters and the like when an organic layer is formed on a surface of, for example, a substrate having an anode formed thereon. The means for resolution is characterized in that the inside of an organic EL device production apparatus equipped with an organic film-forming chamber for forming an organic layer on a surface of, for example, a substrate having an anode formed thereon is cleaned with an ozone gas, and the organic layer is then formed.

12 Claims, 3 Drawing Sheets

Fig. 1

OZONE TEST IN DELIVERY CHAMBER
TRANSITION OF CONTACT ANGLE
ON SURFACE OF INSERTED SUBSTRATE

OZONE TEST IN STOCKER CHAMBER
TRANSITION OF CONTACT ANGLE
ON SURFACE OF INSERTED SUBSTRATE

→ AVERAGE VALUE OF CONTACT ANGLE

PRODUCTION METHOD OF ORGANIC EL DEVICE AND CLEANING METHOD OF ORGANIC EL DEVICE PRODUCTION APPARATUS

TECHNICAL FIELD

The present invention relates to a method of stably producing a high quality organic EL device by surely avoiding adverse influence due to organic matters and the like when an organic layer is formed on a surface of, for example, a substrate having an anode formed thereon.

BACKGROUND ART

Electroluminescence devices utilizing an organic compound (organic EL devices) are expected to the application to next-generation displays represented by flat panel type displays as an electrical/optical conversion-based device having high conversion efficiency that has not hitherto been obtained, and in recent years, its development is rapidly proceeded.

Figure 5:
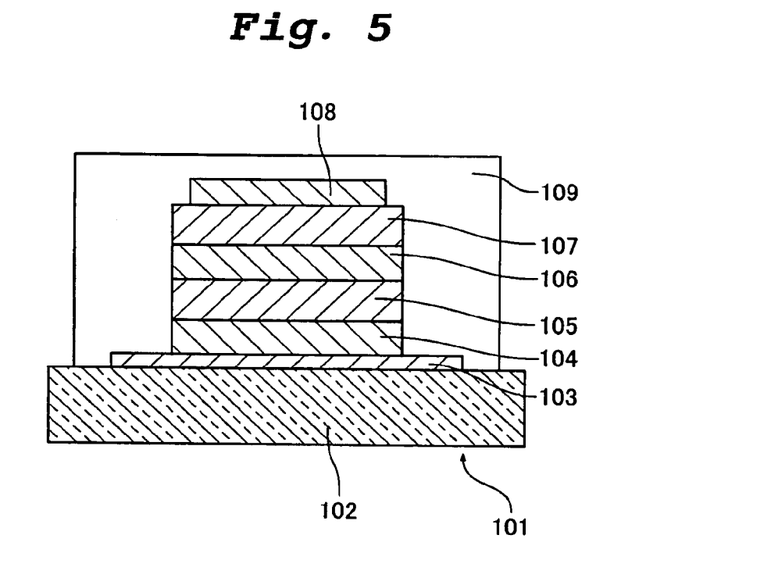
FIG. 5 is a cross sectional view of one example of the constitution of an organic EL device.

As one example of organic EL devices, an organic EL device 101 is exemplified wherein a hole injecting layer 104, a hole transporting layer 105, an emission layer 106, an electron transporting layer 107 and a back electrode (cathode) 108 are laminated on a surface of a substrate 102 comprising a transparent material such as a glass, having an anode (for example, a hole injecting electrode) 103 comprising a transparent conductive film such as ITO film formed on the surface thereof in the previous step, and finally the whole is encapsulated with an encapsulant 109, its cross section being shown in FIG. 5. In such a constitution, the hole injecting layer 104, the hole transporting layer 105, the emission layer 106 and the electron transporting layer 107 each are an organic layer comprising an organic compound having the respective function.

Figure 6:
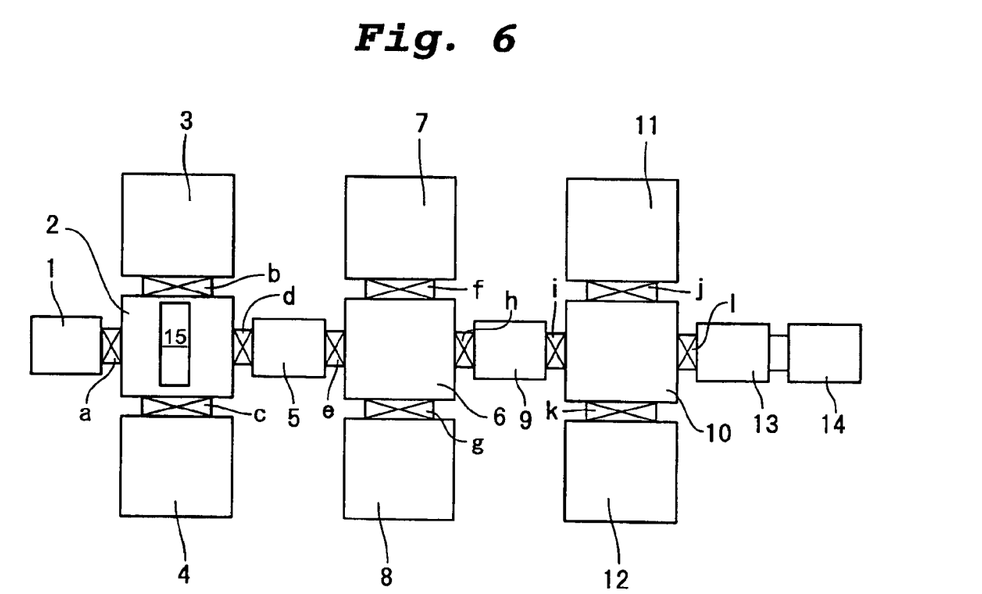
FIG. 6 is a schematic view of one example of an organic layer formation apparatus.

The organic EL device 101 shown in FIG. 5 can be produced using, for example, an apparatus for forming an organic layer on a surface of a substrate having an anode formed on the surface thereof (organic layer formation apparatus), its outline being shown in FIG. 6.

In FIG. 6, numeral 1 is a loading chamber, numeral 2 is a delivery chamber, numeral 3 is a pre-treatment chamber, numeral 4 is an organic film-forming chamber, numeral 5 is a stocker chamber, numeral 6 is a delivery chamber, numeral 7 is an organic film-forming chamber, numeral 8 is an organic film-forming chamber, numeral 9 is a stocker chamber, numeral 10 is a delivery chamber, numeral 11 is an organic film-forming chamber, numeral 12 is an electrode film-forming chamber, numeral 13 is an encapsulating chamber, numeral 14 is an unloading chamber, numeral 15 is a robot for sending the substrate to the organic film-forming chamber, and the signs a to 1 are gate valves. The substrate 102 having the anode 103 formed on the surface thereof (electrode-formed substrate) is set in the loading chamber 1, and sent to the delivery chamber 2 through the gate valve a. The electrode-formed substrate, thereafter, is sent to the pre-treatment chamber 3 with a robot (not shown) provided in the inside of the delivery chamber 2 through the gate valve b, where the substrate is cleaned with an ozone gas, ultraviolet irradiation and the like. Thereafter, the substrate is successively sent to the organic-film-forming chambers 4, 7, 8 and 11, the electrode film-forming chamber 12 and the encapsulating chamber 13 to thereby laminate the hole injecting layer 104, the hole transporting layer 105, the emission layer 106, the electron transporting layer 107 and the back electrode (cathode) 108 on the surface of the cleaned electrode-formed substrate respectively, finally the whole is encapsulated with the encapsulant 109, and the organic EL device 101 is carried out from the unloading chamber 14.

By the way, where an organic layer formation apparatus is operated for a long period of time, a large amount of deposition materials are adhered to an inner wall of an organic film-forming chamber, an adhesion-preventive plate (a protective plate for preventing deposition materials from being adhered to the inner wall of the organic film-forming chamber) set in the inside thereof, and the like, and the adhered deposition materials may adversely affect the formation of a uniform organic layer. Therefore, to avoid such an affair, as a cleaning method of the organic layer formation apparatus, a method of removing deposition materials adhered to the inner wall of the organic film-forming chamber, the adhesion-preventive plate set in the inside thereof, and the like by sublimating the adhered deposition materials by irradiating the inside of the organic film-forming chamber with infrared rays, ultraviolet rays and the like, thereby exhausting the sublimated deposition materials is proposed in, for example, Patent Document 1.

However, even though deposition materials adhered to the inner wall of the organic film-forming chamber, the adhesion-preventive plate set in the side thereof, and the like are removed, there was the case that the produced organic EL devices sometimes include some devices having poor quality.

Further, in general, in the production step of an organic EL device, a step of forming an organic layer on a surface of an electrode-formed substrate using an organic layer formation apparatus is a separate step from a step of forming an electrode on the surface of the substrate. Therefore, there is the case that organic matters and the like in the atmosphere adhere to the surface of the electrode-formed substrate produced in the previous step during setting the substrate to the organic layer formation apparatus. Where the organic layer is formed in the state that organic matters and the like in the atmosphere had been adhered to the surface of the substrate, an obstacle occurs in, for example, adhesion of the organic layer to the surface of the substrate. As a result, this may incur affairs such as decrease in emission efficiency, increase in driving voltage and ephemeralization of emission life, of the formed organic layer.

Therefore, to avoid those affairs, a method of setting an electrode-formed substrate to an organic layer formation apparatus, cleaning the substrate with an ozone gas in a pre-treatment chamber to remove organic matters and the like in the atmosphere adhered to the surface of the substrate, sending the substrate to an organic layer-forming chamber through a delivery chamber, and forming an organic layer on the surface of the substrate is proposed (for example, see Patent Document 2).

However, even though the electrode-formed substrate is cleaned with an ozone gas, there was the case that the produced organic EL devices sometimes include some devices having poor quality.

Patent Document 1: JP-A-2002-60926
Patent Document 2: JP-A-11-45779

DISCLOSURE OF THE INVENTION

Problems that the Invention is to Solve

Accordingly, the present invention has an object to provide a method of stably producing a high quality organic EL device by surely avoiding adverse influence due to organic matters and the like when an organic layer is formed on a surface of an electrode-formed substrate and the like.

Means for Solving the Problems

As a result of various investigations in view of the above problems, the present inventors have found out that even where deposition materials adhered to an inner wall of an organic film-forming chamber, an adhesion-preventive plate set in the inside thereof, and the like are removed, there is the case that the produced organic EL devices sometimes include some devices having poor quality, and this is due to contamination in a delivery chamber. Investigations have not hitherto be made as to what influence the cleanliness of the delivery chamber gives to the formation of an organic layer on the surface of an electrode-formed substrate, and therefore, its countermeasure is not proposed in any fashion.

Further, the present inventors have found out that even where an electrode-formed substrate is cleaned with an ozone gas, there is the case that the produced organic EL devices sometimes include some devices having poor quality, and this is due to organic matters and the like in the atmosphere adhered to the inside of an organic layer formation apparatus in the course of fabricating the apparatus when the apparatus is newly fabricated or the apparatus is disassembled and overhauled. As a result, they have found that where the inside of the apparatus is cleaned with an ozone gas to thereby remove the adhered organic matters and the like in the atmosphere, and an organic layer is then formed on the surface of the electrode-formed substrate, a high quality organic EL device can stably be produced. Investigations have not hitherto be made as to what influence organic matters and the like in the atmosphere adhered to the inside of an organic layer formation apparatus in the course of fabricating the apparatus when the apparatus is newly fabricated or the apparatus is disassembled and overhauled give to the formation of an organic layer on the surface of an electrode-formed substrate, and therefore, its countermeasure is not proposed in any fashion.

The present invention has been made based on the above background. A production method of an organic EL device of the present invention is characterized in that the inside of an organic EL device production apparatus equipped with an organic film-forming chamber for forming an organic layer on a surface of a substrate is cleaned with an ozone gas, and the organic layer is then formed, as described in claim 1.

The production method described in claim 2 is characterized in that, in the production method described in claim 1, the substrate is an electrode-formed substrate.

The production method described in claim 3 is characterized in that, in the production method described in claim 1 or 2, the organic EL device production apparatus is an organic EL device production apparatus equipped with at least an organic film-forming chamber for forming an organic layer on a surface of a substrate, and a delivery chamber having provided in the inside thereof a robot for sending the substrate to the organic film-forming chamber; and the inside of the delivery chamber is cleaned with an ozone gas utilizing time for exchanging a deposition source set in the inside of the organic film-forming chamber for a fresh deposition source, and the organic layer is then formed.

The production method described in claim 4 is characterized in that, in the production method described in claim 1 or 2, when the organic EL device production apparatus is newly fabricated or the apparatus is disassembled and overhauled, the inside of the apparatus is cleaned with an ozone gas, and the organic layer is then formed.

A cleaning method of an organic EL device production apparatus of the present invention is characterized in that the inside of an organic EL device production apparatus equipped with an organic film-forming chamber for forming an organic layer on a surface of a substrate is cleaned with an ozone gas, as described in claim 5.

The cleaning method described in claim 6 is characterized in that, in the cleaning method described in claim 5, the substrate is an electrode-formed substrate.

The cleaning method described in claim 7 is characterized in that, in the cleaning method described in claim 5 or 6, the organic EL device production apparatus is an organic EL device production apparatus equipped with at least an organic film-forming chamber for forming an organic layer on a surface of a substrate, and a delivery chamber having provided in the inside thereof a robot for sending the substrate to the organic film-forming chamber; and the inside of the delivery chamber is cleaned with an ozone gas utilizing time for exchanging a deposition source set in the inside of the organic film-forming chamber for a fresh deposition source.

The cleaning method described in claim 8 is characterized in that, in the cleaning method described in claim 5 or 6, when the organic EL device production apparatus is newly fabricated or the apparatus is disassembled and overhauled, the inside of the apparatus is cleaned with an ozone gas.

EFFECT OF THE INVENTION

According to the present invention, a method of stably producing a high quality organic EL device by surely avoiding adverse influence due to organic matters and the like when an organic layer is formed on a surface of an electrode-formed substrate and the like is provided.

DESCRIPTION OF REFERENCE NUMERALS AND SIGNS

1 Loading chamber
6, 10 Delivery chamber
3 Pre-treatment chamber
4, 7, 8, 11 Organic film-forming chamber
5, 9 Stocker chamber
12 Electrode film-forming chamber
13 Encapsulating chamber
14 Unloading chamber
15 Robot
a to 1 Gate valve
101 Organic EL device
102 Substrate
103 Anode 104 Hole injecting layer
105 Hole transporting layer
106 Emission layer
107 Electron transporting layer
108 Back electrode (cathode)
109 Encapsulant

BEST MODE FOR CARRYING OUT THE INVENTION

The production method of an organic EL device of the present invention is characterized in that the inside of an organic EL device production apparatus equipped with an organic film-forming chamber for forming an organic layer on a surface of a substrate is cleaned with an ozone gas, and the organic layer is then formed. Further, the cleaning method of an organic EL device production apparatus of the present invention is characterized in that the inside of an organic EL device production apparatus equipped with an organic film-forming chamber for forming an organic layer on a surface of a substrate is cleaned with an ozone gas.

As described before, a method of setting an electrode-formed substrate produced in the previous step to an organic layer formation apparatus, cleaning the substrate with an ozone gas in a pre-treatment chamber to remove organic matters and the like in the atmosphere adhered to the surface of the substrate, sending the substrate to an organic layer-forming chamber through a delivery chamber, and forming an organic layer on the surface of the substrate is proposed in Patent Document 2 and the like. However, there is no prior art reference describing or suggesting that an organic layer formation apparatus itself is an object to be cleaned, the inside of the apparatus is cleaned with an ozone gas, and an organic layer is then formed on the surface of the electrode-formed substrate.

In the present invention, the method of cleaning the inside of the organic EL device production apparatus with an ozone gas is not particularly limited. For example, an embodiment wherein an ozone gas generated by an ozonizer (ozone-generating apparatus) is supplied to the inside of the apparatus may be carried out. Confirmation of the necessity for cleaning the inside of the apparatus and confirmation of the cleaning effect may be conducted by, for example, passing a dummy substrate through the inside of the apparatus according to the formation steps of organic layers, and measuring the water contact angle on its surface. Specifically, for example, where the water contact angle is 5° or less (desirably 4° or less), it is evaluated that the cleanliness is good, and where exceeding this value, it is evaluated that there is the necessity of cleaning.

For example, organic matters and the like in the atmosphere more or less enter in the delivery chamber 2 of the organic layer formation apparatus shown in FIG. 6 from the loading chamber 1 through the gate valve a, and deposition materials also more or less enter in the delivery chamber 2 from the organic film-forming chamber 4 through the gate valve c. As a result, the phenomenon occurs that those adhere to the inside of the delivery chamber 2. Further, different deposition materials more or less enter in the delivery chamber 6 from the organic film-forming chamber 7 and the organic film-forming chamber 8, respectively, and as a result, the phenomenon occurs that those adhere to the inside thereof. The present invention is to stably produce a high quality organic EL device by that the inside of the delivery chamber contaminated by the phenomena described above is cleaned with an ozone gas utilizing time for exchanging a deposition source set in the inside of the organic film-forming chamber for a fresh deposition source, which is conducted in the production step of an organic EL device, thereby removing the adhered organic matters and the like in the atmosphere and the adhered deposition materials, and the organic layer is uniformly formed on the surface of the electrode-formed substrate.

The method of cleaning the inside of the delivery chamber with an ozone gas utilizing time for exchanging a deposition source set in the inside of the organic film-forming chamber for a fresh deposition source is not particularly limited. For example, an embodiment wherein an ozone gas generated by an ozonizer is supplied to the delivery chamber may be carried out. In the case of exchanging a deposition source set in the inside of the organic film-forming chamber 4 of the organic layer formation apparatus shown in FIG. 6 for a fresh deposition source, the inside is cleaned by supplying an ozone gas to the delivery chambers 2, 6 and 10. Cleaning of the inside of the delivery chamber is not always conducted simultaneously to all of the delivery chambers. An optional delivery chamber is selected, and only the inside of the selected delivery chamber may be cleaned.

As a cleaning condition, for example, conditions are desirable that an ozone gas is introduced into the inside of a delivery chamber until reaching its pressure to 100 to 300 Torr, and after allowing to stand for 0.5 to 5 hours, high vacuum evacuation is conducted for 0.5 hour or more. Needless to say, such a cycle may be conducted in plural times according to need.

It is desirable to clean the inside of the loading chamber, the pre-treatment chamber, the stocker chamber, the unloading chamber and the like by supplying an ozone gas thereto, simultaneously with cleaning the inside of the delivery chamber. Those chambers also have the possibility that organic matters and the like in the atmosphere or deposition materials adhere to the inside thereof to contaminate the inside, and this adversely affects the formation of a uniform organic layer.

Further, as a method of ensuring the cleanliness of the inside of an organic layer formation apparatus after newly fabricating the apparatus or after disassembling and overhauling the apparatus, there is, for example, a method by degreasing cleaning of a single part before fabricating an apparatus using a cleaning liquid such as an organic solvent or an alkali cleaning agent, without conducting cleaning after fabrication of the apparatus. In this method, however, organic matters and the like in the atmosphere adhere to the cleaned part, and this results in that organic matters and the like in the atmosphere adhere to the inside of the apparatus. Further, there are a method of wiping off the inside of an apparatus with a dust-free and oil-free waste cloth impregnated with isopropyl alcohol after fabrication of the apparatus, and a method of conducting vacuum evacuation while heating to 60 to 80° C. (heat degassing). However, it is impossible in the former method to sufficiently wipe off the inside of the apparatus up to the detailed portions, and the latter method cannot always effectively remove organic matters and the like in the atmosphere adhered to the inside of the apparatus.

In the present invention, when the organic layer formation apparatus is newly fabricated or the apparatus is disassembled and overhauled, the inside of the apparatus is cleaned with an ozone gas, and as a result, organic matters and the like in the atmosphere adhered to the inside of the apparatus can effectively be removed. Therefore, when the inside of the apparatus is cleaned with an ozone gas, and an organic layer is then formed on a surface of an electrode-formed substrate, a high quality organic EL device can stably be produced.

A method of cleaning the inside of the organic layer formation apparatus shown in FIG. 6 with an ozone gas when the apparatus is newly fabricated or the apparatus is disassembled and overhauled is not particularly limited. For example, an embodiment wherein an ozone gas generated by an ozonizer is supplied to every chamber may be carried out. Regarding the organic film-forming chamber and the electrode film-forming chamber, it is desirable to conduct the cleaning in the state that an adhesion-preventive plate is set, and also in the state that a deposition source having a deposition material charged therein is not set. The reason for this is to avoid that the deposition material changes in quality with an ozone gas.

As a cleaning condition, for example, conditions are desirable that an ozone gas is introduced into the inside of the apparatus until reaching its pressure to 100 to 300 Torr, and after allowing to stand for 0.5 to 5 hours, high vacuum evacuation is conducted for 0.5 hour or more. Needless to say, such a cycle may be conducted in plural times according to need.

The embodiment that the substrate on which an organic layer is formed is an electrode-formed substrate is described above as one example, but the substrate on which an organic layer is formed is not limited to this embodiment.

EXAMPLES

The present invention is described in more detail by the following Examples, but the invention is not limited to the following description.

Example 1

Experiment A

Effect of Cleaning Inside of Delivery Chamber of Organic Layer Formation Apparatus with Ozone Gas Six dummy substrates were inserted in the inside of the delivery chamber 2 of the organic layer formation apparatus shown in FIG. 6 that was operated in a certain period of time, followed by high vacuum evacuation (pressure $6.9 \times 10^{-4}$ Pa) for 30 minutes. The chamber was opened to the atmosphere, and the dummy substrates were taken out of the chamber. The water contact angle on the surface of the taken out dummy substrate was measured to evaluate the cleanliness in the inside of the delivery chamber 2. As a result, the initial average value 3.8° was increased to 25.4°. This phenomenon was presumed to be due to that organic matters and the like in the atmosphere or deposition materials, adhered to the inside of the delivery chamber 2, eliminate and again adhere to the dummy substrate, and as a result, the surface was contaminated.

As a first cleaning, an ozone gas was introduced into the inside of the delivery chamber 2 until reaching its pressure to 200 Torr, and after allowing to stand for 2 hours, high vacuum evacuation was conducted for 2 hours. After opening to the atmosphere, six dummy substrates were inserted in the inside of the delivery chamber 2, followed by high vacuum evacuation (pressure $5.3 \times 10^{-4}$ Pa) for 30 minutes. The chamber was opened to the atmosphere, the dummy substrates were taken out of the chamber, and the water contact angle on the surface thereof was measured. As a result, the initial average value 3.5° was increased to 11.3°.

Thereafter, high vacuum evacuation was again conducted for 2 hours. After opening to the atmosphere, six dummy substrates were inserted in the inside of the delivery chamber 2, followed by high vacuum evacuation (pressure $4.5 \times 10^{-4}$ Pa) for 30 minutes. The chamber was opened to the atmosphere, the dummy substrates were taken out of the chamber, and the water contact angle on the surface thereof was measured. As a result, the initial average value 3.5° was increased to 11.3°.

As a second cleaning, an ozone gas was introduced into the inside of the delivery chamber 2 until reaching its pressure to 200 Torr, and after allowing to stand for 2 hours, high vacuum evacuation was conducted for 2 hours. After opening to the atmosphere, six dummy substrates were inserted in the inside of the delivery chamber 2, followed by high vacuum evacuation (pressure $3.9 \times 10^{-4}$ Pa) for 30 minutes. The chamber was opened to the atmosphere, the dummy substrates were taken out of the chamber, and the water contact angle on the surface thereof was measured. As a result, the initial average value 3.8° was increased to 9.5°.

Thereafter, high vacuum evacuation was again conducted for 2 hours. After opening to the atmosphere, six dummy substrates were inserted in the inside of the delivery chamber 2, followed by high vacuum evacuation (pressure $1.9 \times 10^{-4}$ Pa) for 30 minutes. The chamber was opened to the atmosphere, the dummy substrates were taken out of the chamber, and the water contact angle on the surface thereof was measured. As a result, the initial average value 3.5° was increased to 9.0°.

As a third cleaning, an ozone gas was introduced into the inside of the delivery chamber 2 until reaching its pressure to 200 Torr, and after allowing to stand for 2 hours, high vacuum evacuation was conducted for 2 hours. After opening to the atmosphere, six dummy substrates were inserted in the inside of the delivery chamber 2, followed by high vacuum evacuation (pressure $2.8 \times 10^{-4}$ Pa) for 30 minutes. The chamber was opened to the atmosphere, the dummy substrates were taken out of the chamber, and the water contact angle on the surface thereof was measured. As a result, the initial average value 3.4° was increased to 4.6°.

Thereafter, high vacuum evacuation was again conducted for 2 hours. After opening to the atmosphere, six dummy substrates were inserted in the inside of the delivery chamber 2, followed by high vacuum evacuation (pressure $2.3 \times 10^{-4}$ Pa) for 30 minutes. The chamber was opened to the atmosphere, the dummy substrates were taken out of the chamber, and the water contact angle on the surface thereof was measured. As a result, the initial average value 3.6° was increased to 4.1°.

As a fourth cleaning, an ozone gas was introduced into the inside of the delivery chamber 2 until reaching its pressure to 200 Torr, and after allowing to stand for 2 hours, high vacuum evacuation was conducted for 24 hours. After opening to the atmosphere, six dummy substrates were inserted in the inside of the delivery chamber 2, followed by high vacuum evacuation (pressure $1.9 \times 10^{-4}$ Pa) for 30 minutes. The chamber was opened to the atmosphere, the dummy substrates were taken out of the chamber, and the water contact angle on the surface thereof was measured. As a result, the initial average value 3.6° remained unchanged.

The detailed data of the above results are shown in Table 1. Further, a transition of an average value of the water contact angle on the surface of the dummy substrates is shown in FIG. 1.

TABLE 1

| Number of ozone intro-duction | Ozone intro-duction pressure (Torr) | Time for allowing to stand (hr) | High vacuum evacu-ation time (hr) | Pressure (× 10⁻⁴ Pa) | Number of measure-ment | Initial average value of six dummy substrates | Water contact angle (°) | | | | | | | | Average value of Max and Min |
|---|---|---|---|---|---|---|---|---|---|---|---|---|---|---|---|
| | | | | | | | Dummy substrate No. | | | | | | | | |
| | | | | | | | 1 | 2 | 3 | 4 | 5 | 6 | Max | Min | |
| Initial | — | — | — | 6.9 | 0 | 3.8 | 27.6 | 26.7 | 23.6 | 23.2 | 25.1 | 27.6 | 27.6 | 23.2 | 25.4 |
| First | 200 | 2 | 2 | 5.3 | 1 | 3.5 | 12.3 | 12.5 | 8.9 | 12.8 | 10.6 | 13.6 | 13.6 | 8.9 | 11.3 |
| | | | 2 | 4.5 | 2 | 3.5 | 12.3 | 12.5 | 8.9 | 12.8 | 10.6 | 13.6 | 13.6 | 8.9 | 11.3 |
| Second | 200 | 2 | 2 | 3.9 | 3 | 3.8 | 7.5 | 10.8 | 8.7 | 11.4 | 8.8 | 10.6 | 11.4 | 7.5 | 9.5 |
| | | | 2 | 1.9 | 4 | 3.5 | 7.2 | 7.6 | 11.7 | 6.2 | 8.3 | 8.5 | 11.7 | 6.2 | 9.0 |
| Third | 200 | 2 | 2 | 2.8 | 5 | 3.4 | 4.4 | 4.4 | 4.2 | 4.4 | 4.5 | 5.0 | 5.0 | 4.2 | 4.6 |
| | | | 2 | 2.3 | 6 | 3.6 | 3.8 | 3.8 | 4.2 | 4.1 | 4.1 | 4.4 | 4.4 | 3.8 | 4.1 |
| Fourth | 200 | 2 | 24 | 1.9 | 7 | 3.6 | 3.7 | 3.5 | 3.4 | 3.4 | 3.8 | 3.8 | 3.8 | 3.4 | 3.6 |

Figure 1:
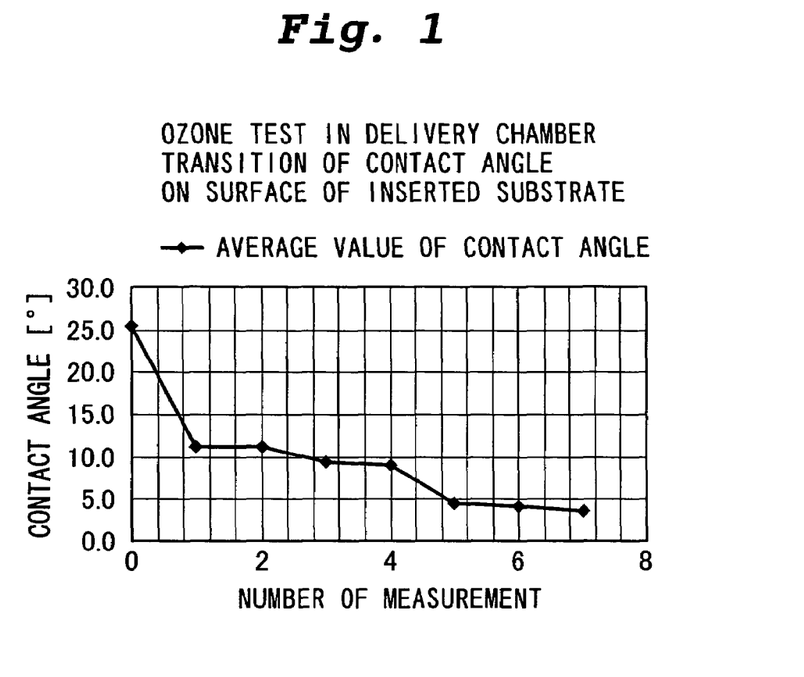
FIG. 1 is a graph showing a transition of an average value of the water contact angle on the surface of the dummy substrates in Example 1.

As is apparent from FIG. 1, the average value of the water contact angle on the surface of the dummy substrates decreased with increasing the number of cleaning with an ozone gas. From this fact, it was understood that a large amount of organic matters and the like in the atmosphere or deposition materials adhered to the inside of the delivery chamber 2 before initiation of the experiment, but the inside of the delivery chamber 2 was cleaned by removing those by the cleaning with an ozone gas.

Experiment B

Figure 2:
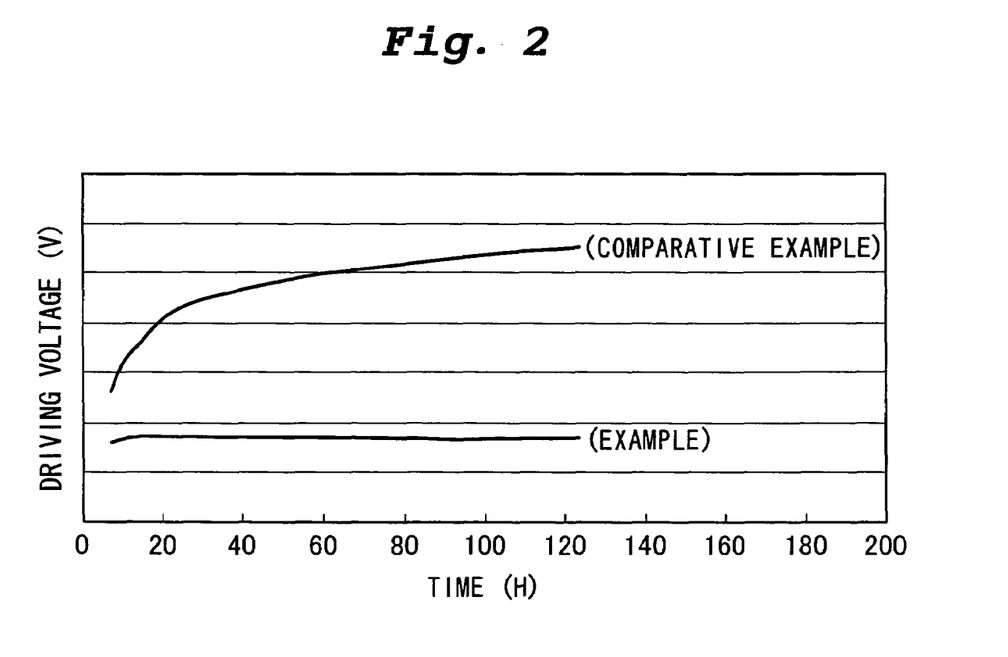
FIG. 2 is a graph showing a comparison in performance of the organic EL devices in Example 1.

Production of Organic EL Device Using Organic Layer Formation Apparatus, Inside of Delivery Chamber of which Having been Cleaned with Ozone Gas An organic EL device was produced using the organic layer formation apparatus wherein the cleaning with an ozone gas had been applied to the inside of the delivery chamber four times in Experiment A, according to the conventional method. Ten organic EL devices were optionally selected, and those performances were examined. As a result, any devices did not bring about rise of driving voltage value in a short period of time (FIG. 2, Example). On the other hand, when an organic EL device was produced using the organic layer formation apparatus wherein the cleaning with an ozone gas had not been applied to the inside of the delivery chamber, some devices that brought about rise of driving voltage value in a short period of time were present in the produced devices (FIG. 2, Comparative Example). From this fact, it was understood that when the inside of the delivery chamber of the organic layer formation apparatus is cleaned with an ozone gas, and the organic layer is then formed on the surface of the electrode-formed substrate, it is possible to maintain its high quality and improve the yield, in the produced organic EL device.

Example 2

Experiment A

Effect of Cleaning Inside of Organic Layer Formation Apparatus with Ozone Gas

Six dummy substrates were inserted in the inside of the stocker chamber 5 of the organic layer formation apparatus shown in FIG. 6 that was newly fabricated using parts that had been subjected to degreasing cleaning using a cleaning liquid such as an organic solvent or an alkali cleaning agent before fabrication of the apparatus, followed by high vacuum evacuation (pressure $6.9 \times 10^{-4}$ Pa) for 30 minutes. The chamber was opened to the atmosphere, and the dummy substrates were taken out of the chamber. The water contact angle on the surface of the taken out dummy substrate was measured to evaluate the cleanliness in the inside of the organic layer formation apparatus. As a result, the initial average value 3.8° was increased to 26.1°. This phenomenon was presumed to be due to that organic matters and the like in the atmosphere, adhered to the inside of the stocker chamber 5, eliminate and again adhere to the dummy substrate, and as a result, the surface was contaminated.

As a first cleaning, an ozone gas was introduced into the inside of the stocker chamber 5 until reaching its pressure to 200 Torr, and after allowing to stand for 2 hours, high vacuum evacuation was conducted for 2 hours. After opening to the atmosphere, six dummy substrates were inserted in the inside of the stocker chamber 5, followed by high vacuum evacuation (pressure $5.3 \times 10^{-4}$ Pa) for 30 minutes. The chamber was opened to the atmosphere, the dummy substrates were taken out of the chamber, and the water contact angle on the surface thereof was measured. As a result, the initial average value 3.5° was increased to 12.0°.

Thereafter, high vacuum evacuation was again conducted for 2 hours. After opening to the atmosphere, six dummy substrates were inserted in the inside of the stocker chamber 5, followed by high vacuum evacuation (pressure $4.5 \times 10^{-4}$ Pa) for 30 minutes. The chamber was opened to the atmosphere, the dummy substrates were taken out of the chamber, and the water contact angle on the surface thereof was measured. As a result, the initial average value 3.5° was increased to 12.0°.

As a second cleaning, an ozone gas was introduced into the inside of the stocker chamber 5 until reaching its pressure to 200 Torr, and after allowing to stand for 2 hours, high vacuum evacuation was conducted for 2 hours. After opening to the atmosphere, six dummy substrates were inserted in the inside of the stocker chamber 5, followed by high vacuum evacuation (pressure $3.9 \times 10^{-4}$ Pa) for 30 minutes. The chamber was opened to the atmosphere, the dummy substrates were taken out of the chamber, and the water contact angle on the surface thereof was measured. As a result, the initial average value 3.8° was increased to 11.0°.

Thereafter, high vacuum evacuation was again conducted for 2 hours. After opening to the atmosphere, six dummy substrates were inserted in the inside of the stocker chamber 5, followed by high vacuum evacuation (pressure $1.9 \times 10^{-4}$ Pa) for 30 minutes. The chamber was opened to the atmosphere, the dummy substrates were taken out of the chamber, and the water contact angle on the surface thereof was measured. As a result, the initial average value 3.5° was increased to 10.5°.

As a third cleaning, an ozone gas was introduced into the inside of the stocker chamber 5 until reaching its pressure to 200 Torr, and after allowing to stand for 2 hours, high vacuum evacuation was conducted for 2 hours. After opening to the atmosphere, six dummy substrates were inserted in the inside of the stocker chamber 5, followed by high vacuum evacuation (pressure $2.8 \times 10^{-4}$ Pa) for 30 minutes. The chamber was opened to the atmosphere, the dummy substrates were taken out of the chamber, and the water contact angle on the surface thereof was measured. As a result, the initial average value 3.4° was increased to 4.9°.

Thereafter, high vacuum evacuation was again conducted for 2 hours. After opening to the atmosphere, six dummy substrates were inserted in the inside of the stocker chamber 5, followed by high vacuum evacuation (pressure $2.3 \times 10^{-4}$ Pa) for 30 minutes. The chamber was opened to the atmosphere, the dummy substrates were taken out of the chamber, and the water contact angle on the surface thereof was measured. As a result, the initial average value 3.6° was increased to 4.8°.

As a fourth cleaning, an ozone gas was introduced into the inside of the stocker chamber 5 until reaching its pressure to 200 Torr, and after allowing to stand for 2 hours, high vacuum evacuation was conducted for 24 hours. After opening to the atmosphere, six dummy substrates were inserted in the inside of the stocker chamber 5, followed by high vacuum evacuation (pressure $1.9 \times 10^{-4}$ Pa) for 30 minutes. The chamber was opened to the atmosphere, the dummy substrates were taken out of the chamber, and the water contact angle on the surface thereof was measured. As a result, the initial average value 3.6° was decreased to 3.4°.

Figure 3:
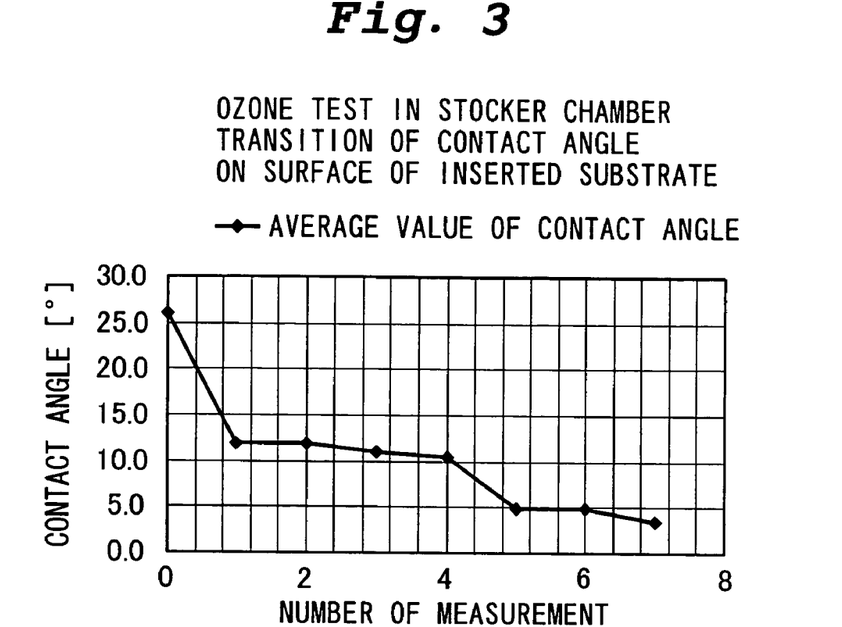
FIG. 3 is a graph showing a transition of an average value of the water contact angle on the surface of the dummy substrates in Example 2.

The detailed data of the above results are shown in Table 2. Further, a transition of an average value of the water contact angle on the surface of the dummy substrates is shown in FIG. 3.

fabricating the apparatus, but the inside of the apparatus was cleaned by removing those by the cleaning with an ozone gas.

Experiment B

Figure 4:
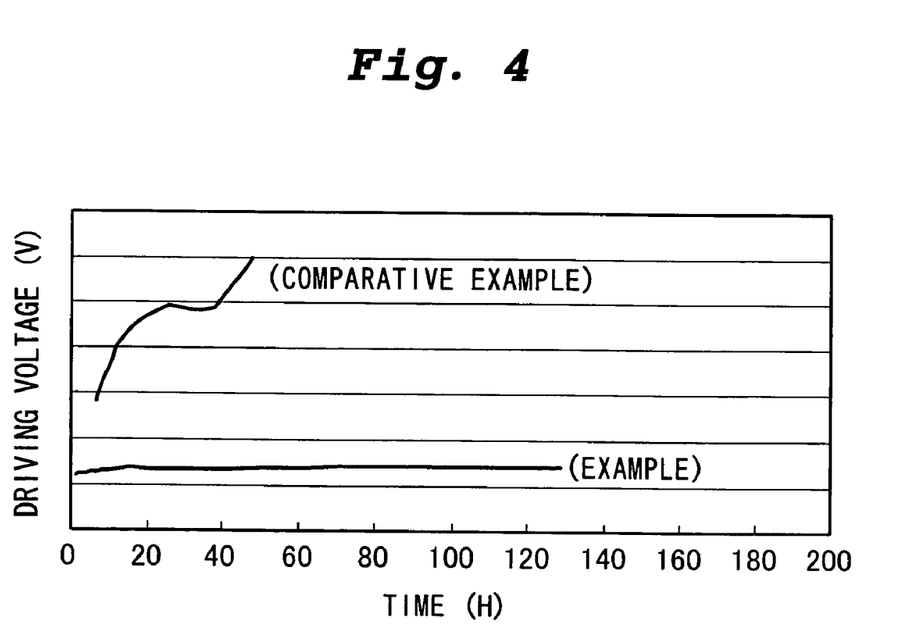
FIG. 4 is a graph showing a comparison in performance of the organic EL devices in Example 2.

Production of Organic EL Device Using Organic Layer Formation Apparatus, Inside of Which Having been Cleaned with Ozone Gas An organic EL device was produced using the organic layer formation apparatus having been subjected to the cleaning with an ozone gas four times in Experiment A, according to the conventional method. Ten organic EL devices were optionally selected, and those performances were examined. As a result, any devices did not bring about rise of driving voltage value in a short period of time (FIG. 4, Example). On the other hand, when an organic EL device was produced using the organic layer formation apparatus having been not subjected to the cleaning with an ozone gas after newly fabricating the apparatus, some devices that brought about rise of driving voltage value in a short period of time were present in the produced devices (FIG. 4, Comparative Example). From this fact, it was understood that when the inside of the organic layer formation apparatus is cleaned with an ozone gas, and the organic layer is then formed on the surface of the electrode-formed substrate, it is possible to maintain its high quality and improve the yield, in the produced organic EL device.

Example 3

With respect to the organic layer formation apparatus shown in FIG. 6 that was disassembled and overhauled, it was confirmed that the same effect is obtained by conducting the same experiment as the experiment described in Example 2.

INDUSTRIAL APPLICABILITY

The present invention has industrial applicability in the point that it can provide a method of stably producing a high quality organic EL device by surely avoiding adverse influence due to organic matters and the like when an organic layer is formed on a surface of, for example, a substrate having an anode formed thereon.

TABLE 2

| Number of ozone introduction | Ozone introduction pressure (Torr) | Time for allowing to stand (hr) | High vacuum evacuation time (hr) | Pressure ($\times 10^{-4}$ Pa) | Number of measurement | Initial average value of six dummy substrates | Dummy substrate No. 1 | 2 | 3 | 4 | 5 | 6 | Max | Min | Average value of Max and Min |
|---|---|---|---|---|---|---|---|---|---|---|---|---|---|---|---|
| Initial | — | — | — | 6.9 | 0 | 3.8 | 28.3 | 27.4 | 24.3 | 23.9 | 25.8 | 28.3 | 28.3 | 23.9 | 26.1 |
| First | 200 | 2 | 2 | 5.3 | 1 | 3.5 | 13.0 | 13.2 | 9.6 | 13.5 | 11.3 | 14.3 | 14.3 | 9.6 | 12.0 |
|  |  |  | 2 | 4.5 | 2 | 3.5 | 13.0 | 13.2 | 9.6 | 13.5 | 11.3 | 14.3 | 14.3 | 9.6 | 12.0 |
| Second | 200 | 2 | 2 | 3.9 | 3 | 3.8 | 9.0 | 12.3 | 10.2 | 12.9 | 10.3 | 12.1 | 12.9 | 9.0 | 11.0 |
|  |  |  | 2 | 1.9 | 4 | 3.5 | 8.7 | 9.1 | 13.2 | 7.7 | 9.8 | 10.0 | 13.2 | 7.7 | 10.5 |
| Third | 200 | 2 | 2 | 2.8 | 5 | 3.4 | 4.7 | 4.7 | 4.5 | 4.7 | 4.8 | 5.3 | 5.3 | 4.5 | 4.9 |
|  |  |  | 2 | 2.3 | 6 | 3.6 | 4.5 | 4.5 | 4.9 | 4.8 | 4.8 | 5.1 | 5.1 | 4.5 | 4.8 |
| Fourth | 200 | 2 | 24 | 1.9 | 7 | 3.6 | 3.4 | 3.5 | 3.1 | 3.1 | 3.5 | 3.6 | 3.6 | 3.1 | 3.4 |

As is apparent from FIG. 3, the average value of the water contact angle on the surface of the dummy substrates decreased with increasing the number of cleaning with an ozone gas. From this fact, it was understood that a large amount of organic matters and the like in the atmosphere adhered to the inside of the apparatus at the time of newly

The invention claimed is:

1. A production method for an organic EL device, produced in an organic EL device production apparatus equipped with an organic film-forming chamber for forming an organic layer on a surface of a substrate, characterized in that an ozone gas is introduced into the inside of the organic film-forming chamber until reaching its pressure to 100 to 300 Torr, and after allowing to stand for 0.5 to 5 hours, the inside of the organic film-forming chamber is cleaned with high vacuum evacuation for 0.5 hours or more, and the organic layer is then formed in the organic film-forming chamber.

2. The production method as claimed in claim 1, characterized in that the substrate is an electrode-formed substrate.

3. The production method as claimed in claim 1, characterized in that the organic EL device production apparatus is an organic EL device production apparatus equipped with at least an organic film-forming chamber for forming an organic layer on a surface of a substrate, and a delivery chamber having provided in the inside thereof a robot for sending the substrate to the organic film-forming chamber; and an ozone gas is introduced into the inside of the delivery chamber until reaching its pressure to 100 to 300 Torr, and after allowing to stand for 0.5 to 5 hours, the inside of the delivery chamber is cleaned with high vacuum evacuation for 0.5 hours or more, utilizing time for exchanging a deposition source set in the inside of the organic film-forming chamber for a fresh deposition source, and the organic layer is then formed.

4. The production method as claimed in claim 1, characterized in that when the organic EL device production apparatus is newly fabricated or the apparatus is disassembled and overhauled, an ozone gas is introduced into the inside of the apparatus until reaching its pressure to 100 to 300 Torr, and after allowing to stand for 0.5 to 5 hours, the inside of the apparatus is cleaned with high vacuum evacuation for 0.5 hours or more, and the organic layer is then formed.

5. A cleaning method of an organic EL device production apparatus, equipped with an organic film-forming chamber for forming an organic layer on a surface of a substrate, characterized in that an ozone gas is introduced into the inside of the organic film-forming chamber until reaching its pressure to 100 to 300 Torr, and after allowing to stand for 0.5 to 5 hours, the inside of the organic film-forming chamber is cleaned with high vacuum evacuation for 0.5 hours or more.

6. The cleaning method as claimed in claim 5, characterized in that the substrate is an electrode-formed substrate.

7. The cleaning method as claimed in claim 5, characterized in that the organic EL device production apparatus is an organic EL device production apparatus equipped with at least an organic film-forming chamber for forming an organic layer on a surface of a substrate, and a delivery chamber having provided in the inside thereof a robot for sending the substrate to the organic film-forming chamber; and an ozone gas is introduced into the inside of the delivery chamber until reaching its pressure to 100 to 300 Torr, and after allowing to stand for 0.5 to 5 hours, the inside of the delivery chamber is cleaned with high vacuum evacuation for 0.5 hours or more, utilizing time for exchanging a deposition source set in the inside of the organic film-forming chamber for a fresh deposition source.

8. The cleaning method as claimed in claim 5, characterized in that when the organic EL device production apparatus is newly fabricated or the apparatus is disassembled and overhauled, an ozone gas is introduced into the inside of the apparatus until reaching its pressure to 100 to 300 Torr, and after allowing to stand for 0.5 to 5 hours, the inside of the apparatus is cleaned with high vacuum evacuation for 0.5 hours or more.

9. The production method as claimed in claim 2, characterized in that the organic EL device production apparatus is an organic EL device production apparatus equipped with at least an organic film-forming chamber for forming an organic layer on a surface of a substrate, and a delivery chamber having provided in the inside thereof a robot for sending the substrate to the organic film-forming chamber; and an ozone gas is introduced into the inside of the delivery chamber until reaching its pressure to 100 to 300 Torr, and after allowing to stand for 0.5 to 5 hours, the inside of the delivery chamber is cleaned with high vacuum evacuation for 0.5 hours or more, utilizing time for exchanging a deposition source set in the inside of the organic film-forming chamber for a fresh deposition source, and the organic layer is then formed.

10. The production method as claimed in claim 2, characterized in that when the organic EL device production apparatus is newly fabricated or the apparatus is disassembled and overhauled, an ozone gas is introduced into the inside of the apparatus until reaching its pressure to 100 to 300 Torr, and after allowing to stand for 0.5 to 5 hours, the inside of the apparatus is cleaned with high vacuum evacuation for 0.5 hours or more and the organic layer is then formed.

11. The cleaning method as claimed in claim 6, characterized in that the organic EL device production apparatus is an organic EL device production apparatus equipped with at least an organic film-forming chamber for forming an organic layer on a surface of a substrate, and a delivery chamber having provided in the inside thereof a robot for sending the substrate to the organic film-forming chamber; and an ozone gas is introduced into the inside of the delivery chamber until reaching its pressure to 100 to 300 Torr, and after allowing to stand for 0.5 to 5 hours, the inside of the delivery chamber is cleaned with high vacuum evacuation for 0.5 hours or more, utilizing time for exchanging a deposition source set in the inside of the organic film-forming chamber for a fresh deposition source.

12. The cleaning method as claimed in claim 6, characterized in that when the organic EL device production apparatus is newly fabricated or the apparatus is disassembled and overhauled, an ozone gas is introduced into the inside of the apparatus until reaching its pressure to 100 to 300 Torr, and after allowing to stand for 0.5 to 5 hours, the inside of the apparatus is cleaned with high vacuum evacuation for 0.5 hours or more.

* * * * *